Jan. 31, 1967 H. C. BROWN ETAL 3,302,138

VOLTAGE CONTROLLED CRYSTAL OSCILLATOR

Filed Aug. 18, 1965 6 Sheets-Sheet 1

INVENTOR.
Harry C. Brown
James V. Hawley

BY Claude Funkhouser
ATTORNEY
R. R. Anderson
AGENT

VOLTAGE CONTROLLED CRYSTAL OSCILLATOR

Filed Aug. 18, 1965 6 Sheets-Sheet 4

VOLTAGE CONTROLLED CRYSTAL OSCILLATOR

Filed Aug. 18, 1965 6 Sheets-Sheet 5

3,302,138
Patented Jan. 31, 1967

3,302,138

VOLTAGE CONTROLLED CRYSTAL OSCILLATOR

Harry C. Brown, Glen Burnie, Md., and James V. Hawley, Titusville, Fla., assignors, by mesne assignments, to the United States of America as represented by the Secretary of the Navy Filed Aug. 18, 1965, Ser. No. 480,832
2 Claims. (Cl. 334—15)

The present invention relates to a crystal oscillator and more particularly to a crystal oscillator having a very wide tuning range, a linear tuning response, and high stability.

Prior art oscillators have been plagued by many undesirable features which materially reduce their effectiveness and in some applications make them practically useless. Present techniques employing prior art oscillators either suffer with an oscillator with poor linearity, or use a voltage controlled multivibrator having rather poor stability, or use some form of frequency discriminator either in a control loop or as an open loop measuring device. The use of a frequency discriminator involves additional complexity and the circuit designer is still faced with achieving the required linearity and stability in the discriminator. Furthermore, it is usually necessary to employ one or more mixers and offset oscillators to convert the relatively low multivibrator frequency up to a useful frequency range.

Many of the above-noted deficiencies have been overcome by the present invention wherein the technique disclosed has been developed for linearly controlling the frequency of an oscillator having a resonator containing a crystal, a voltage variable reactance, and other reactance elements which modify the resonator's characteristics to achieve linear control. The resulting advantages of the device are good stability which is largely due to the use of a piezoelectric crystal as a stabilizing element, good linearity, and a wide tuning range anywhere in the frequency band from 1 to 30 megacycles, as well as the elimination of frequency discriminators.

An object of the present invention is the provision of an accurate voltage controlled crystal oscillator.

Another object is the provision of a voltage controlled oscillator with a linear tuning characteristic.

Another object is the provision of a voltage controlled oscillator having a very wide tuning range.

Still another object is the provision of a voltage controlled crystal oscillator having unusually high stability.

Other objects, advantages and novel features of the invention will become apparent from the following detailed description of the invention when considered in conjunction with the accompanying drawings wherein:

FIG. 14 shows a linearity chart of the oscillator of FIG. 12.

Figure 10:
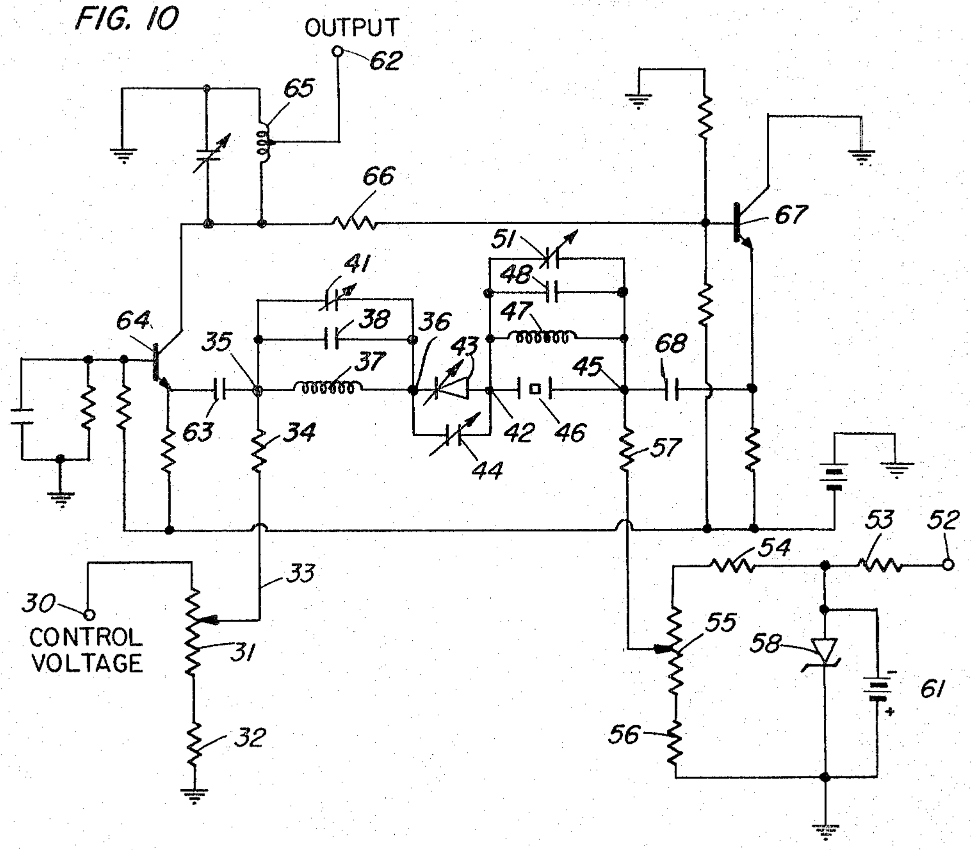
FIG. 10 shows a schematic diagram of a 20 megacycle voltage controlled crystal oscillator.

Turning now to a detailed description of the invention there is shown in FIG. 10, which presents a clear simplified view of the device, an input terminal 30 whereby a control voltage is applied to the oscillator. In series connection between terminal 30 and ground are potentiometer 31 and fixed resistor 32, the sliding arm of the potentiometer applying, via lead 33 and resistor 34, a voltage potential to junction 35.

Connected between junction 35 and another junction 36 is a choke coil 37 having in parallel with it a fixed capacitor 38 and a much smaller, trimmer, capacitor 41. Located between terminal 36 and another terminal 42 is a voltage-responsive variable capacitance device 43, in parallel with which is a small trimmer capacitor 44. The term voltage-responsive variable capacitance device as used herein designates any device which exhibits usable variations in capacity at a first impedance level in response to variations in current or voltage of a first range of magnitudes, and exhibits a substantial change in impedance level for a predetermined voltage or current outside of said range of magnitudes. An example of such a device is a voltage responsive variable capacity diode which is responsive to variations in reverse bias to exhibit variations in capacitance at a high impedance level and responsive to a forward bias to exhibit a very low impedance.

Connected between junction 42 and another junction 45 is a second tuned circuit consisting of a piezoelectric crystal 46 located in parallel with a choke coil 47, a fixed capacitance 48, and a variable capacitance 51, the tuned circuit resonating at the frequency of the particular crystal chosen. Potential for the entire oscillator is supplied by the voltage impressed on a terminal 52 acting through a voltage divider network composed of resistors 53, 54, 55, and 56. The operating potential is applied to terminal 45 after passing through the sliding arm of resistor 55 and a dropping resistor 57. Regulation for the power supply is obtained by a zener diode 58, which may be of the type 1N4099, or the like, connected between the junction of resistors 53 and 54 and ground, an appropriate bias being furnished the zener diode 58 by a small battery 61.

Output for the oscillator appears at output terminal 62, the signal passing from junction 35 through a coupling capacitor 63, a NPN transistor 64 and a tapped output coil 65. The necessary feedback loop, required to enhance and reinforce the oscillations of the circuit, is provided by resistor 66, connected to output coil 65, and a NPN transistor 67, the emitter of which passes the feedback signal through a coupling capacitor 68, back to junction 45.

Figure 1:
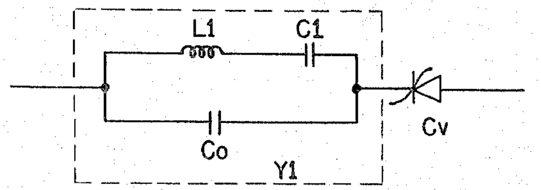
FIG. 1 shows a simple silicon capacitor network.

Turning now to a detailed description of why the invention operates as it does, and for a mathematical proof of its circuitry, there is shown in FIG. 1 an oscillator employing only a crystal in series with a voltage responsive variable capacitance device (Varicap). Under normal conditions this oscillator could only be tuned over a frequency range shown by the following equations: from $$f_1=f_r\sqrt{1+\frac{C_1}{C_0+C_{v\,max}}}\approx f_r\left(1+{}^1\!/\!_2\frac{C_1}{C_0+C_{v\,max}}\right) \quad (1)$$

to $$f_2=f_r\sqrt{1+\frac{C_1}{C_0+C_{v\,min}}}\approx f_r\left(1+{}^1\!/\!_2\frac{C_1}{C_0+C_{v\,min}}\right) \quad (2)$$

where:

$C_1$=the crystal motional capacitance
$C_0$=the crystal facing capacitance
$C_v$=the Varicap capacitance
$f_r$=the resonant frequency of the crystal so $$\Delta f=f_2-f_1\approx f_r\frac{C_1}{2}\left(\frac{1}{C_0+C_{v\ min}}-\frac{1}{C_0+C_{v\ max}}\right) \quad (3)$$

assuming a typical 20 mc. crystal having $C_1$=.005 pf. and $C_0$=1.5 pf., and a typical voltage responsive variable capacitance having $C_{v\ min}$=2 pf. and $C_{v\ max}$=15 pf., then the tuning range is:

$$f\approx 20\times 10^6\frac{.005\times 10^{-12}}{2}\times\left(\frac{1}{(1.5+2)\times 10^{-12}}-\frac{1}{(1.5+15)\times 10^{-12}}\right) \quad (4)$$

$f$=11.25 kc.

Figure 2:
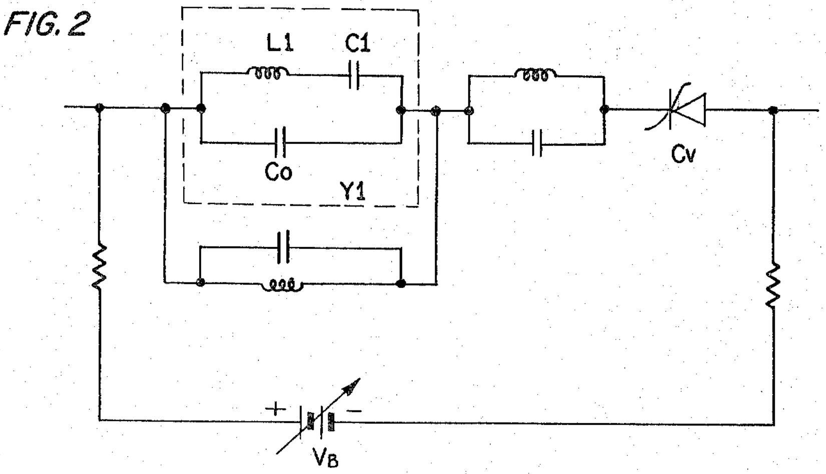
FIG. 2 shows a schematic of a linear voltage controlled crystal oscillator.

Not only is the tuning range of this circuit very limited, but the frequency vs. voltage characteristic is extremely non-linear. The resonator network shown in FIG. 2, however, extends the effective tuning range of the oscillator many times this range and closely approximates a linear tuning characteristic. In the circuits of both FIG. 1 and FIG. 2 it is assumed that the resonator network is operating in an oscillator which utilizes a series resonant mode of the network, such as a grounded base transistor oscillator network. The sustaining circuits have been eliminated from all of the figures except those of FIGS. 10 and 12 in order to simplify the diagrams.

Figure 3:
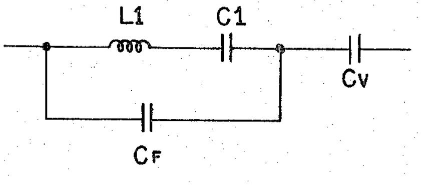
FIG. 3 shows the network for an idealized wideband resonator.

An understanding of the basic operation of the invention can best be gained by going through the step by step development of the device. The first step in the development is to extend the tuning range of the oscillator considerably beyond that of FIG. 1. In FIG. 3 there is shown a network containing the motional capacitance of the crystal (losses neglected), a facing network ($C_F$), which contains the crystal facing capacitance $C_0$ and other elements to be described later and which may be made to exhibit either positive or negative values of capacitance, as well as a series capacitance $C_V$. If the equivalent facing capacitance $C_F$ is made to equal a negative capacitance, then the tuning range can be greatly extended. For example, using the 20 mc. crystal with the typical voltage responsive variable capacitance described above, and assuming $C_F$=1.5 pf., the equivalent tuning range of the network can be determined by substituting $C_F$ for $C_0$ in Equation 3 as $$\Delta f\approx 20\times 10^6\times\frac{.005}{2}\left(\frac{1}{0.5}-\frac{1}{13.5}\right)=96 \text{ kc.} \quad (5)$$

Figure 4:
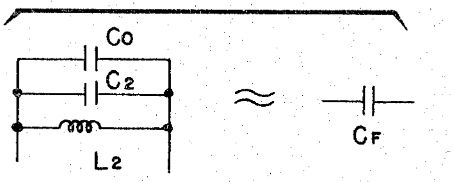
FIG. 4 shows a network for approximating crystal capacitance for small frequency deviations.

$C_F$ may be synthesized to a good approximation over the frequency range of interest by the network shown in FIG. 4. Inductor $L_2$ effectively forms a frequency dependent negative capacitance in parallel with $C_0$ and $C_2$, while $C_2$ represents circuit and coil stray capacitances which may also be placed in parallel with a small variable capacitor for circuit adjustment if it is desired to make inductor $L_2$ fixed rather than variable. It may be shown that for a change in frequency $\Delta f$, the change in equivalent capacitance of the network is $$\Delta C\approx C_c\left[\frac{2\Delta f/f_r}{1+2\Delta f/f_r}\right] \quad (6)$$

where $f_r$=the resonant frequency of the crystal
$C_c=C_0+C_2-C_F$
$C_F$=the capacitance the network is required to synthesize.

Then going on further where $C_0$=1.5 pf., $C_A$=3 pf., $C_F$=1.5 pf. and $\Delta f$=100 kcs.

$$\Delta C\approx 6\left[\frac{2\times\frac{100\times 10^3}{20\times 10^6}}{1+\frac{2\times 100\times 10^3}{20\times 10^6}}\right]\approx .06 \text{ pf.} \quad (7)$$

so the condition that $C_F$ remain constant over the frequency range of interest is approximately satisfied.

Having achieved a means of extending the tuning range of the device it is now necessary to linearize the control characteristic. Using the general case of Equation 1 where $C_v$ is some effective series capacitance between minimum and maximum and $f_1$ is the network resonant frequency corresponding to the particular value of $C_v$, and defining $\Delta f$ as the difference between the resonant frequency of the network and the resonant frequency of the crystal, $$\Delta f=f_1-f_r\approx\frac{f_rC_1}{2(C_F+C_v)} \quad (8)$$

rearranging terms we get $$C_v=\frac{f_rC_1}{2\Delta f}-C_F \qquad C_v=C_X'-C_F \quad (9)$$

where $$C_X'=\frac{f_rC_1}{2\Delta f}=C_v+C_F$$

Figure 6:
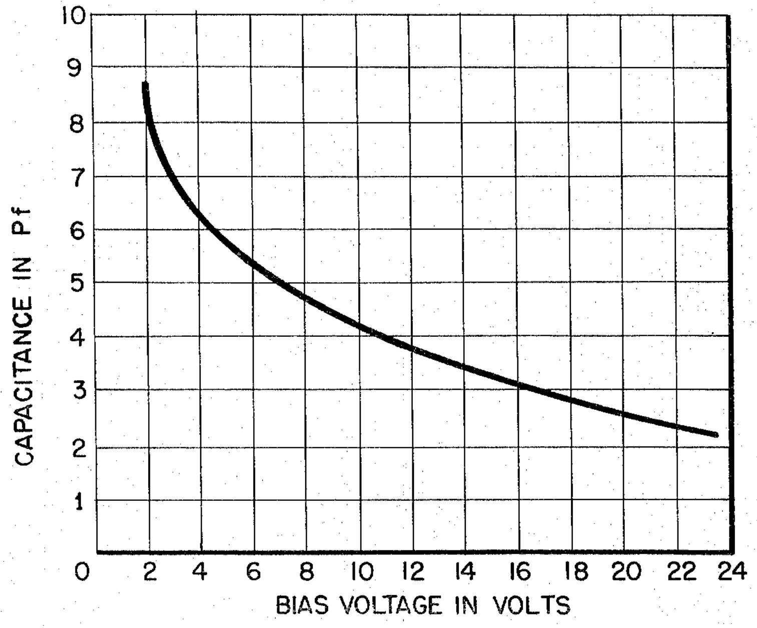
FIG. 6 shows a graph of typical silicon capacitance plotted against voltage characteristic.
Figure 7A:
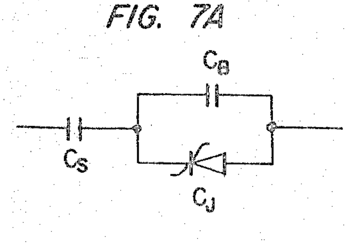
FIG. 7A shows an equivalent series network.

It will be noted that Equation 9 represents the effective series capacitance required to achieve a network resonant frequency $\Delta f$ cycles above $f_r$ for a given $C_F$. The component $C_X'$ represents the effective combination of $C_v$ and $C_F$ required to achieve this frequency and is plotted in FIG. 5. In FIG. 6 there is shown a plot of a voltage responsible variable capacitance vs. voltage with the plot being made on a linear voltage scale instead of the more familiar logarithmic scale in order to more truly depict the characteristics of the capacitance. Although the abrupt junction variable capacitance approximately obeys the relationship $$C_j\approx\frac{K_1}{\sqrt{V+V_1}} \quad (10)$$

there is no easy mathematical approach for determining the linearity of a circuit except by trial and error point by point so the curve of FIG. 6 will be used to develop the linearization network. It is evident from Equations 9 and 10, however, that the variable capacitance alone cannot satisfy the linearity requirements. Therefore, the solution to the problem, as shown by the circuitry of the present invention, is to place a fixed capacitance in parallel with the variable capacitance to limit the capacitance that the network approaches at high voltages (low junction capacitance) and place an equivalent capacitance in series with this capacitance to limit the value of capacitance that the network approaches at low voltages (high junction capacitance). This arrangement is shown in FIG. 7A. The effective series capacitance is then $$C_v=\frac{(C_j+C_B)C_S}{C_j+C_B+C_S}$$

Letting this equation be divided into a fixed and a variable part it becomes $$C_v=C_v'+C_v''=\frac{(C_j+C_B)C_S}{C_j+C_B+C_S} \quad (11)$$

where $C_v'$=the variable part
$C_v''$=the fixed part (to be described later)

Therefore, the condition for resonance is satisfied when $$C_v'+C_v''=C_X'-C_F \quad (12)$$

Figure 5:
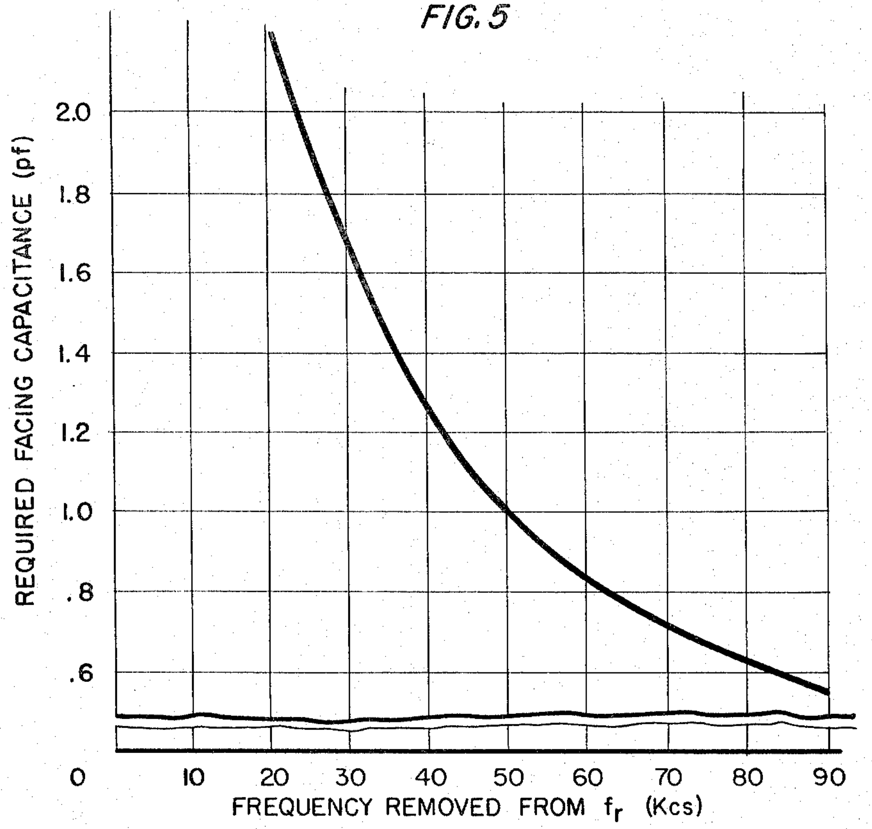
FIG. 5 shows a graph of required facing capacitance plotted against frequency.
Figure 8:
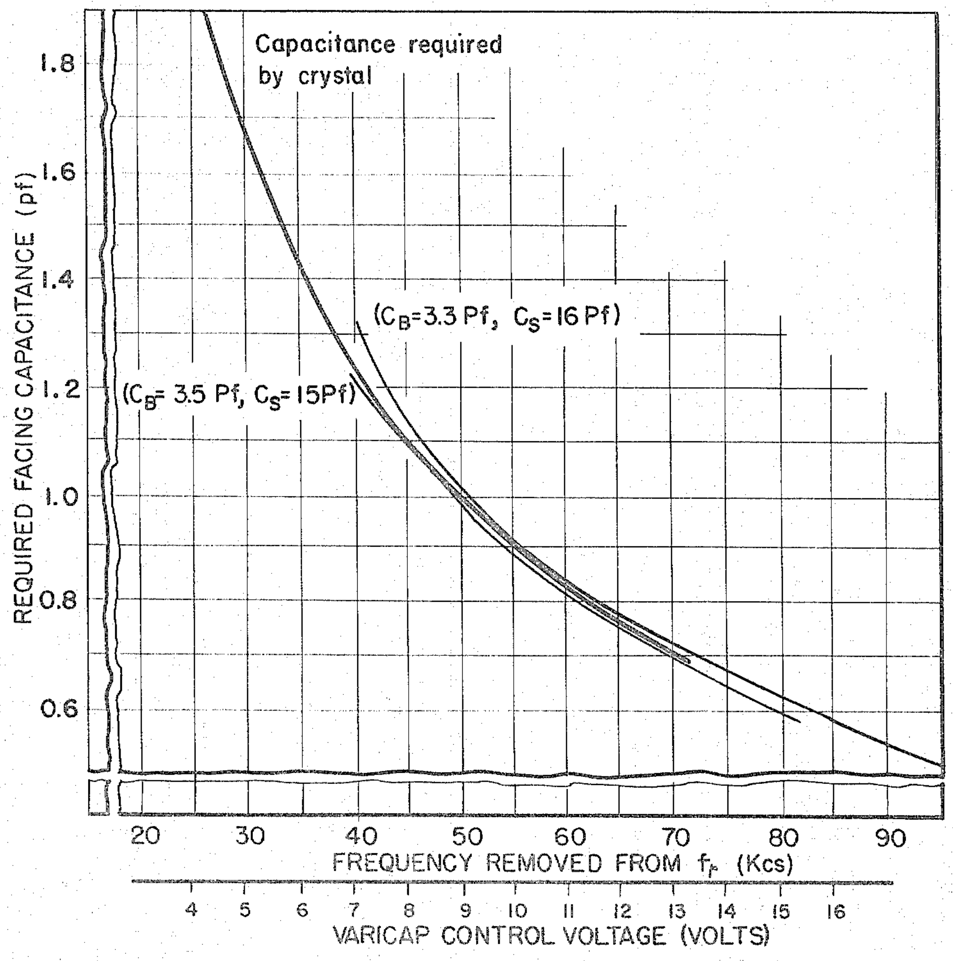
FIG. 8 shows trial curves used in the linearization process.

The solution to the linearization problem is then carried out as illustrated in FIG. 8 by determining a suitable linear voltage scale to superimpose on the linear frequency scale of required $C_X'$ vs. frequency taken from FIG. 5. Curves of $C_V'$ vs. voltage are then plotted for various combinations of $C_B$ and $C_S$ where $C_V''$ is selected such that the curve of $C_V'=C_V-C_V''$ intersects the curve of $C_X$ at one or more points. The curve representing values of $C_B$ and $C_S$ which best fits the curve of $C_X'$ over the desired tuning range is then selected. The curves for two combinations of $C_B$ and $C_S$ are shown in FIG. 8. $C_F$ is then selected so that $$C_F=-C_V'' \quad (13)$$

Figure 7B:
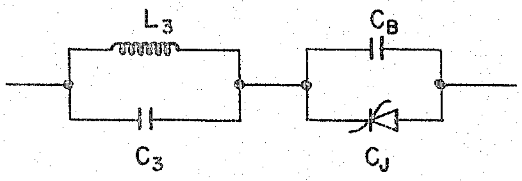
FIG. 7B shows an actual series network.

It should be noted in FIG. 7B that $C_S$ is actually synthesized by a coil in parallel with a capacitor. This is done to allow the varactor to be biased from a potential connected to the ends of the resonator network. This method permits the variable capacitance to be biased from a low direct current resistance without seriously degrading the loaded Q of the resonator network. As shown above for $C_F$, the presence of the coil does not appreciably alter the assumption that $C_S$ is constant.

Figure 9:
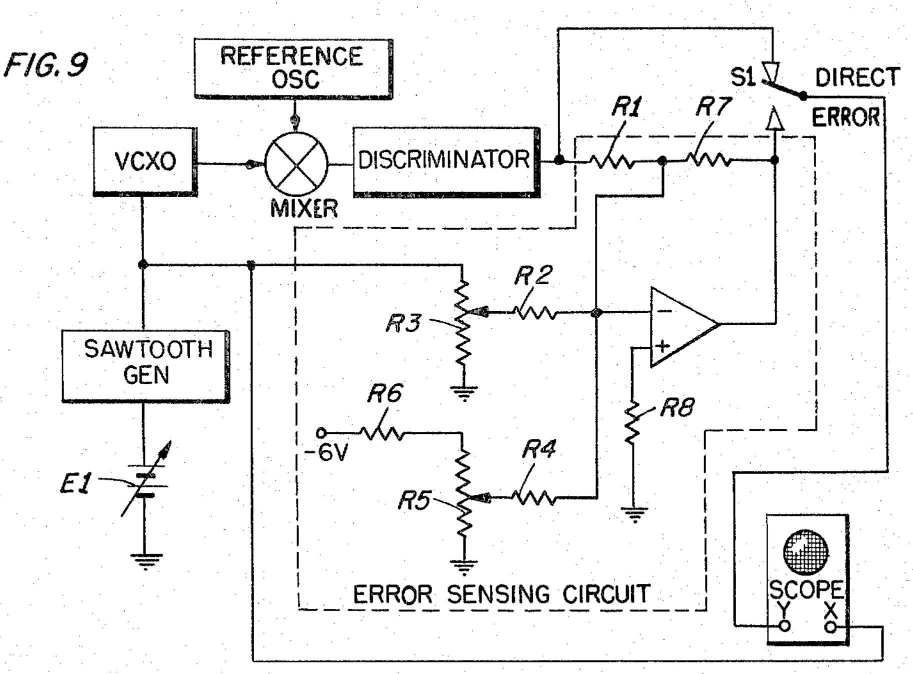
FIG. 9 shows the schematic used in a test setup.

An experimental method for rapidly determining the exact values required for the network has also been developed and its basic setup is shown in FIG. 9. The sawtooth generator connected in series with a fixed bias $E_1$ is used to sweep the voltage back and forth across the desired range and, at the same time, furnishes a horizontal voltage to the oscilloscope and provides a reference voltage proportional to the desired oscillator scale factor to the error sensing circuit. The voltage controlled oscillator output is then mixed with a reference oscillator to provide a frequency suitable for use in a linear pulse count discriminator. For preliminary alignment the output of the discriminator is fed directly to the Y axis of the scope. In this fashion the trace on the scope should appear as a straight line having a slope proportional to the scale factor of the oscillator if the oscillator tuning characteristic is preferably linear, since the Y axis input is proportional to the oscillator frequency and the X axis input is proportional to control voltage. Any deviation from the linearity of the oscillator will appear as a deviation from a straight line on the trace. Once the oscillator appears to be linear and exhibit the proper slope, the slope is switched to the error circuit where the discriminator output is compared with the control voltage and a fixed offset which is introduced to compensate for the fixed bias on the oscillator variable capacitance and the offset of the reference oscillator frequency from the lowest frequency of the voltage controlled crystal oscillator. Since any deviation from zero (0) volts output of the error circuit then corresponds to a deviation from a perfect, linear tuning characteristic of the oscillator, the resolution of the scope can be made much higher and very minute deviations can be measured. Using this method, considerable computation and plotting time can be saved since, in effect, the oscillator circuit and test setup combine to function as an analog computer with each sweep of the sawtooth generator serving as one complete computation run. A scope camera can be used to record the data or an XY plotter can be substituted for the scope.

Figure 11:
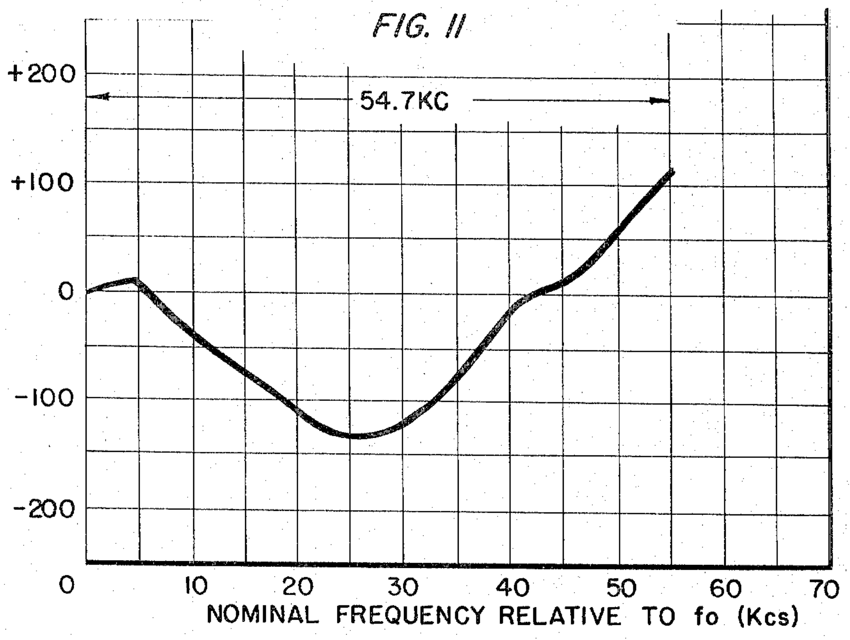
FIG. 11 shows a linearity chart of the oscillator of FIG. 10.
Figure 13:
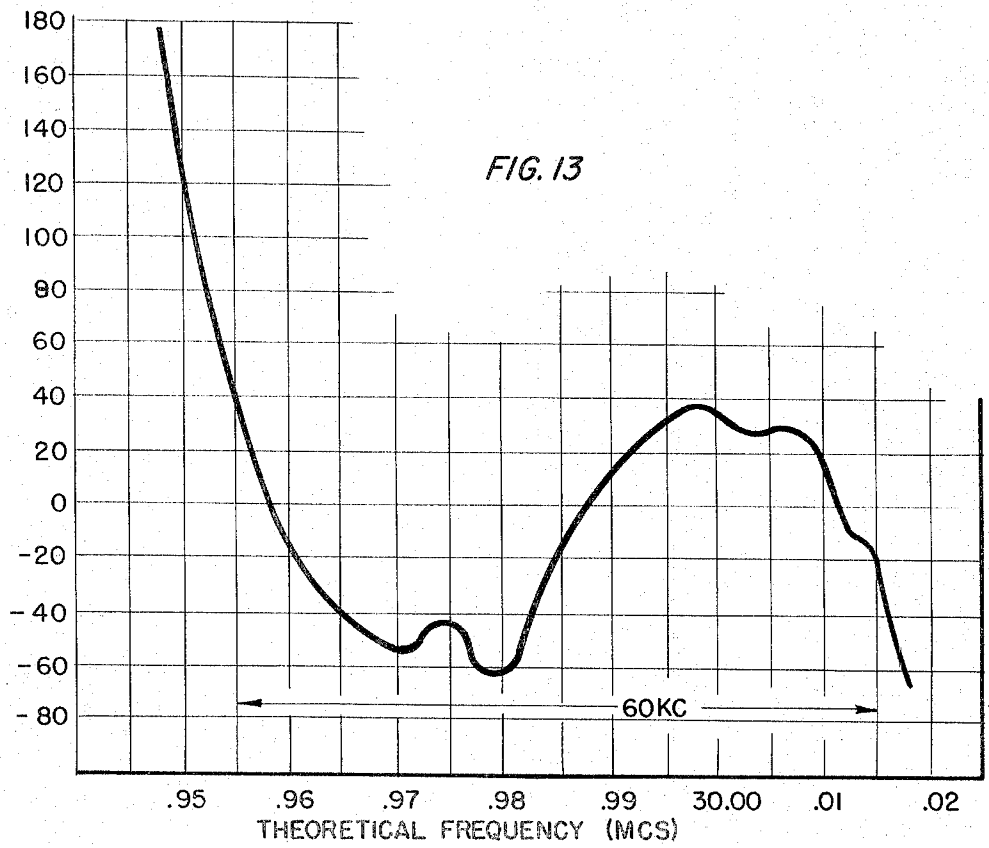
Figure 12:
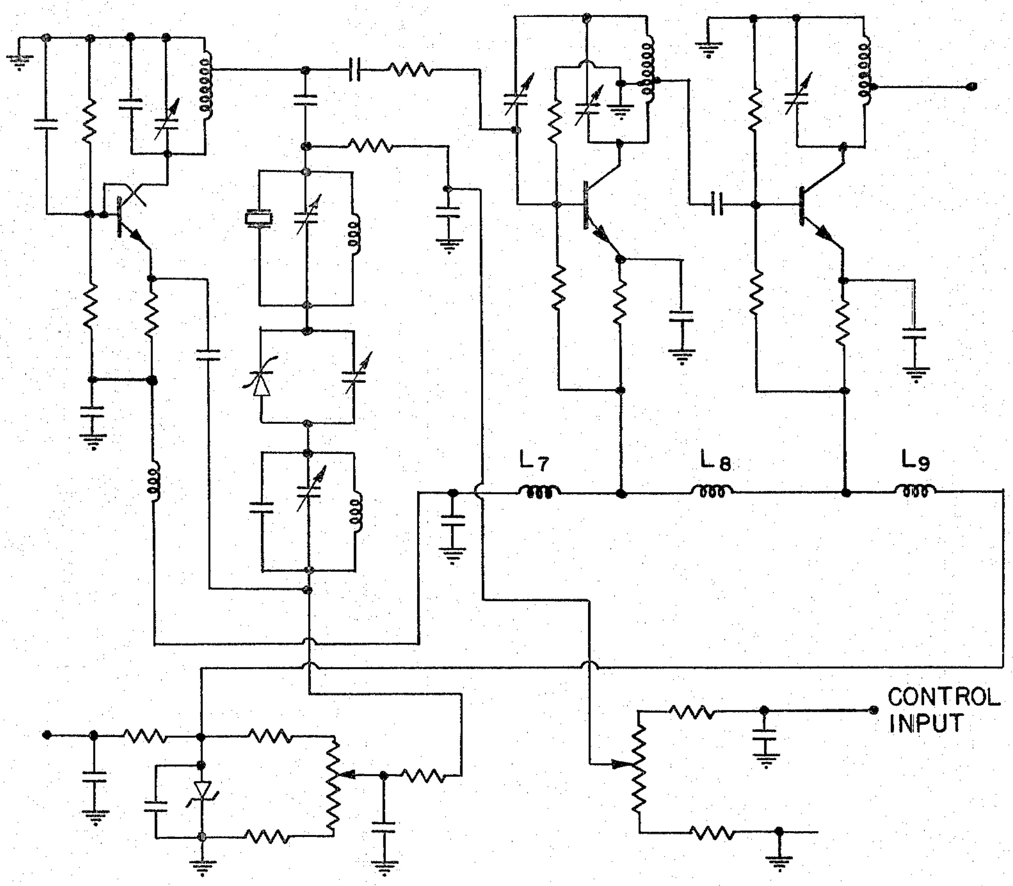
FIG. 12 shows a schematic diagram of a 30 megacycle voltage controlled crystal oscillator.

It is obvious from the above detailed description of the structure and operation of the present invention that there is disclosed a new and novel, accurate, voltage controlled crystal oscillator. Also one which is highly stable, has a wide tuning range, and a linear tuning characteristic throughout its complete range. Several oscillators have been constructed using the disclosed techniques, such as the 20 megacycle oscillator shown schematically in FIG. 10, while FIG. 11 shows the test results indicating a deviation from linearity of less than ± 135 c.p.s. over a 54 kc. tuning range. In further support of the invention's novelty, there is shown in FIG. 12 a schematic of a 30 mc. voltage controlled crystal oscillator having an improved and simplified sustaining circuit, while in FIG. 13 there is shown that this oscillator deviates from linearity less than ±60 c.p.s. over a 60 kc. tuning range.

Obviously many modifications and variations of the present invention are possible in the light of the above teachings. It is therefore to be understood that within the scope of the appended claims the invention may be practiced otherwise than as specifically described.

What is claimed is:

1. A voltage controlled crystal oscillator comprising
a piezoelectric crystal;
a voltage responsive variable capacitance connected in series with the crystal;
a terminal for receiving a control voltage;
a first fixed capacitance connected in parallel with the crystal;
a second fixed capacitance connected in parallel with the voltage responsive variable capacitance;
a third fixed capacitance connected in series with the voltage responsive variable capacitance, said second and third fixed capacitances being of equal value; and
means connecting the terminal with the third fixed capacitance whereby a control voltage applied to the terminal causes the voltage responsive variable capacitance to vary and thereby vary the frequency of the crystal throughout its tuning range.

2. A voltage controlled crystal oscillator comprising
a piezoelectric crystal;
a voltage responsive variable capacitance series connected to the crystal;
means for applying a control voltage to the variable capacitance thereby tuning the oscillator throughout its range;
a first tank circuit connected in parallel with the crystal, said tank circuit having at least a fixed capacitance with a negative capacitance value equal to the facing capacitance of the crystal;
a capacitance in parallel with variable capacitance to limit the capacitance that the network approaches at high variable capacitance voltages; and
a second tank circuit connected in series with the variable capacitance, said tank circuit having at least a fixed capacitance to limit the capacitance that the network approaches at low variable capacitance voltages, the fixed capacitance in the second tank circuit being of equal value with the capacitance in parallel with the variable capacitance.

References Cited by the Examiner

UNITED STATES PATENTS

| | | | |
|---|---|---|---|
| 3,068,427 | 12/1962 | Weinberg | 331—158 |
| 3,154,753 | 10/1964 | Rusy | 331—116 |
| 3,176,244 | 3/1965 | Newell et al. | 331—116 |
| 3,200,349 | 8/1965 | Bangart | 331—116 |

ROY LAKE, *Primary Examiner.*

JOHN KOMINSKI, *Assistant Examiner.*